(12) United States Patent
Takeshima (10) Patent No.: US 12,299,850 B2
(45) Date of Patent: May 13, 2025

(54) MEDICAL INFORMATION PROCESSING APPARATUS, MEDICAL INFORMATION PROCESSING METHOD, AND MEDICAL INFORMATION PROCESSING PROGRAM

(71) Applicant: Canon Medical Systems Corporation, Otawara (JP)

(72) Inventor: Hidenori Takeshima, Kawasaki (JP)

(73) Assignee: Canon Medical Systems Corporation, Otawara (JP)

( * ) Notice: Subject to any disclaimer, the term of this patent is extended or adjusted under 35 U.S.C. 154(b) by 449 days.

(21) Appl. No.: 17/808,334

(22) Filed: Jun. 23, 2022

(65) Prior Publication Data

US 2022/0414835 A1 Dec. 29, 2022

(30) Foreign Application Priority Data

Jun. 25, 2021 (JP) .................. 2021-105900

(51) Int. Cl.
*G06T 5/70* (2024.01)

(52) U.S. Cl.
CPC ...... *G06T 5/70* (2024.01); *G06T 2207/10081* (2013.01); *G06T 2207/10088* (2013.01); *G06T 2207/20016* (2013.01)

(58) Field of Classification Search
CPC ............. G06T 5/70; G06T 2207/10081; G06T 2207/10088; G06T 2207/20016; G06T 5/60; G06T 2207/20081; G06T 2207/20084; G01R 33/5608
See application file for complete search history.

(56) References Cited

U.S. PATENT DOCUMENTS

| 4,876,542 A | * | 10/1989 | van Bavel | H03M 3/418 |
| | | | | 341/200 |
| 12,181,553 B2 | * | 12/2024 | Schlemper | G01R 33/5608 |
| 2019/0336033 A1 | | 11/2019 | Takeshima | |

(Continued)

FOREIGN PATENT DOCUMENTS

JP  2019-93126 A  6/2019

OTHER PUBLICATIONS

Aggarwal, H. K. et al., "MoDL: Model Based Deep Learning Architecture for Inverse Problems," IEEE Transaction on Medical Imaging, vol. 38, 2019. (31 pages).

(Continued)

*Primary Examiner* — Aaron W Carter
(74) *Attorney, Agent, or Firm* — Oblon, McClelland, Maier & Neustadt, L.L.P.

(57) ABSTRACT

According to one embodiment, a medical information processing apparatus comprising processing circuitry. The processing circuitry performs, on each of a plurality of resolution data items, one or more times of first noise reduction processing of reducing noise and one or more times of first DC processing of enhancing a data consistency, and generate output data items corresponding the resolution data items. when processing the second and subsequent resolution data items, The processing circuitry performs one or more times of second noise reduction processing and one or more times of second DC processing on a target resolution data item and one or more output data items generated before the target resolution data item, and generates a newly output data item.

15 Claims, 11 Drawing Sheets

(56) References Cited

U.S. PATENT DOCUMENTS

| | | | | |
|---|---|---|---|---|
| 2019/0346522 A1* | 11/2019 | Botnar | | G01R 33/5676 |
| 2019/0365341 A1* | 12/2019 | Chan | | G06T 7/0012 |
| 2019/0378271 A1* | 12/2019 | Takeshima | | G16H 30/20 |
| 2020/0034998 A1* | 1/2020 | Schlemper | | G06T 5/70 |
| 2020/0241096 A1* | 7/2020 | Bustin | | G01R 33/4818 |
| 2020/0249299 A1* | 8/2020 | Botnar | | G06T 7/0012 |
| 2020/0364494 A1* | 11/2020 | Lee | | G06N 3/08 |
| 2022/0260660 A1* | 8/2022 | Ennis | | G01R 33/56316 |
| 2022/0327662 A1* | 10/2022 | Matsuura | | G06T 3/4046 |
| 2022/0414835 A1* | 12/2022 | Takeshima | | G01R 33/5608 |
| 2024/0095978 A1* | 3/2024 | Sun | | G06T 11/006 |
| 2024/0290011 A1* | 8/2024 | Zhou | | G06F 17/14 |

OTHER PUBLICATIONS

Yang, Y. et al., "Deep ADMM-Net for Compressive Sensing MRI," $30^{th}$ Conference on Neural Information Processing Systems (NIPS), 2016. (9 pages).

Simonyan, K. et al., "Very Deep Convolutional Networks for Large-Scale Image Recognition," ICLR 2015, arXiv:1409.1556. (14 pages).

\* cited by examiner

MEDICAL INFORMATION PROCESSING APPARATUS, MEDICAL INFORMATION PROCESSING METHOD, AND MEDICAL INFORMATION PROCESSING PROGRAM

CROSS-REFERENCE TO RELATED APPLICATIONS

This application is based upon and claims the benefit of priority from Japanese Patent Application No. 2021-105900, filed Jun. 25, 2021, the entire contents of which are incorporated herein by reference.

FIELD

Embodiments described herein relate generally to a medical information processing apparatus, a medical information processing method, and a medical information processing program.

BACKGROUND

With the advancement of machine learning, the application of machine learning models is also progressing in the medical field. For example, there is a method of performing image reconstruction processing by applying a machine learning model to magnetic resonance (MR) images having multiple different resolutions.

In general, it is known that when a machine learning model is applied to a medical image, improving the data consistency between input data and output data that is obtained after applying the machine learning model enhances image quality. However, no consideration has been given as to how to introduce the processing of improving the data consistency to a machine learning model that processes multiple resolutions.

DETAILED DESCRIPTION

In general, according to one embodiment, a medical information processing apparatus comprising processing circuitry. The processing circuitry acquires a plurality of resolution data items having different resolutions each other. The processing circuitry performs, on each of the plurality of resolution data items, one or more times of first noise reduction processing of reducing noise and one or more times of first DC processing of enhancing a data consistency, and generate output data items corresponding to each of the plurality of resolution data items. when processing the second and subsequent resolution data items, The processing circuitry performs one or more times of second noise reduction processing and one or more times of second DC processing on a target resolution data item and one or more output data items generated before the target resolution data item, and generates a newly output data item.

Hereinafter, a medical information processing apparatus, a medical information processing method, and a medical information processing program according to the present embodiment will be described with reference to the accompanying drawings. In the following embodiments, elements assigned the same reference numeral perform the same operation, and repeat descriptions will be omitted as appropriate. An embodiment will be described below with reference to the accompanying drawings.

First Embodiment

A medical information processing apparatus according to the present embodiment will be described with reference to the block diagram shown in FIG. 1.

A medical information processing apparatus 1 according to the present embodiment includes a memory 11, an input interface 12, a communication interface 13, and processing circuitry 14.

The medical information processing apparatus 1 according to the embodiment described herein may be included in a console, a workstation, or the like, and may be included in a medical image diagnostic apparatus such as a magnetic resonance imaging (MRI) apparatus or a computed tomography (CT) apparatus.

The memory 11 stores various data described later, a trained model, and the like. The memory 11 is a semiconductor memory element, such as a random access memory (RAM) or a flash memory, a hard disk drive (HDD), a solid state drive (SSD), an optical disk, or the like. The memory 11 may be, for example, a CD-ROM drive, a DVD drive, or a drive which reads and writes various kinds of information from and in a portable storage medium such as a flash memory.

The input interface 12 includes circuitry that receives various instructions and information input from a user. The input interface 12 includes circuitry relating to, for example, a pointing device such as a mouse, or an input device such as a keyboard. The circuitry included in the input interface 12 is not limited to circuitry relating to a physical operational component such as a mouse or a keyboard. For example, the input interface 12 may include electrical signal processing circuitry which receives an electrical signal corresponding to an input operation from an external input device provided separately from the medical information processing apparatus 1, and outputs the received electrical signal to the various types of circuitry included in the medical information processing apparatus 1.

The communication interface 13 performs data exchange with an external apparatus through wires or wirelessly. Since a general communication means can be adopted for the communication method and the interface structure, description thereof will be omitted.

The processing circuitry 14 includes an acquisition function 141, a noise reduction function 142, a DC function 143, a training function 144, a model execution function 145, and a display control function 146. The noise reduction function 142 and the DC function 143 are also collectively called a processing function. The processing circuitry 14 includes a processor (not shown) as a hardware resource.

The acquisition function 141 acquires a plurality of input data items. The plurality of input data items are medical data items having different resolutions each other. The medical data items may be collected at different resolutions. The medical data items may be generated from data items containing information of a plurality of resolutions. Examples of the types of the medical data include k-space data collected by a magnetic resonance imaging (MRI) apparatus, an MR image, projection data collected by a computed tomography (CT) apparatus, sinogram data, or a CT image. In the present embodiment, temporal resolution is assumed as the "resolution". Specifically, the input data are data having different temporal resolutions, such as data obtained by collecting one frame at three seconds of imaging time or data obtained by collecting one frame at six seconds of imaging time. For example, k-space data collected radial sampling with the MRI apparatus contains information of different resolutions; thus, the temporal resolution of the data can be adjusted by the number of spokes used for the image reconstruction. Specifically, data reconstructed with three spokes as a unit and data reconstructed with six spokes as a unit have different temporal resolutions. The resolution is not limited to a temporal resolution but may be other data resolutions such as spatial resolution, and the processing of the medical information processing apparatus 1 according to the present embodiment can also be applied to other data resolutions in the same manner. For convenience of explanation, the plurality of input data items having different temporal resolutions may be hereinafter referred to as first resolution data, second resolution data, etc., to distinguish them from each other.

The noise reduction function 142 executes processing of reducing noise included in the data.

The data consistency (DC) function 143 executes processing of enhancing the data consistency, such as processing of reducing an error with input data.

In other words, the processing function including the noise reduction function 142 and the DC function 143 executes, multiple times, one or more times of noise reduction processing by the noise reduction function 142 and one or more times of DC processing by the DC function 143 on each of the plurality of input data items, and generates output data items corresponding to each of the plurality of input data items.

The training function 144 designs the noise reduction function 142 and the DC function 143 as part of a network model, and is implemented when training the network model. The training function 144 trains the network model by executing the processing function using training data including the plurality of input data items acquired by the acquisition function 141. When the training is completed, a trained model is generated.

The model execution function 145 is implemented when the trained model is used. The model execution function 145 applies the trained model to the plurality of input data items acquired by the acquisition function 141, and outputs high-quality data with, for example, enhanced noise reduction and data consistency as an execution result.

For example, the display control function 146 displays the status of the training of the network model performed by the training function 144 and the result of the execution performed by the model execution function 145 on an external display, or the like.

The various functions of the processing circuitry 14 may be stored in the memory 11 in the form of a program executable by a computer. In this case, the processing circuitry 14 can also be said to be a processor that reads a program corresponding to these various functions from the memory 11 and executes the program to thereby implement the functions corresponding to the respective programs. In other words, the processing circuitry 14 which has read the respective programs accordingly has multiple functions, etc., shown in the processing circuitry 14 in FIG. 1.

Figure 1:
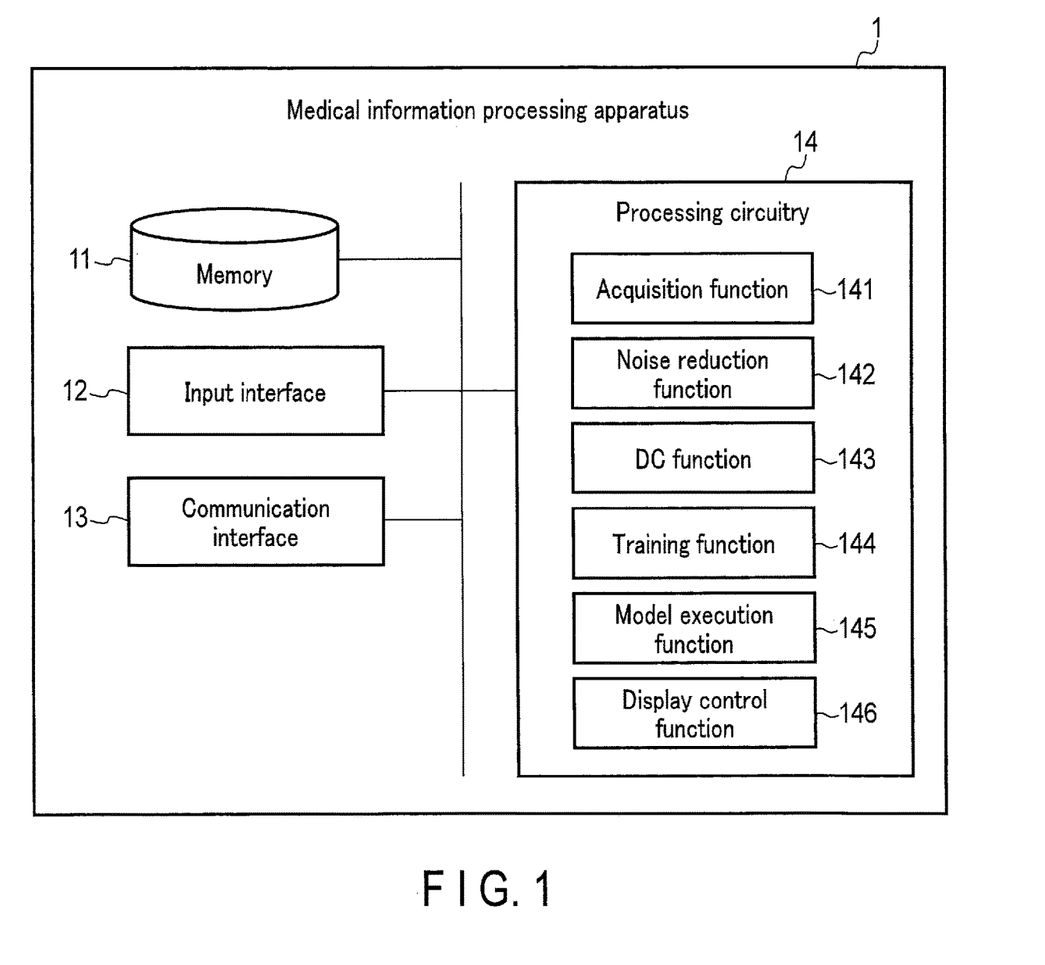
FIG. 1 is a block diagram showing a medical information processing apparatus according to the present embodiment.

FIG. 1 illustrates that these various functions are implemented by the single processing circuitry 14; however, a plurality of independent processors may be combined to constitute the processing circuitry 14, so that the functions are implemented by the respective processors executing the programs. In other words, each of the above-described functions may be configured as a program so that single processing circuitry executes each program, or a specific function may be implemented in dedicated, independent program execution circuitry.

Next, an example of the network model used in the medical information processing apparatus 1 according to the first embodiment will be described with reference to the conceptual diagram shown in FIG. 2.

A network model 20 used in the medical information processing apparatus 1 according to the first embodiment includes a plurality of processing blocks 21 and an output block 22. Specifically, the plurality of processing blocks 21 are connected to each other, and the output block 22 is disposed in the final stage as an output layer of the network model 20. A predetermined number of processing blocks 21 may be disposed, such as connecting four processing blocks 21, in accordance with a task of utilizing the network model 20, and the like.

Each of the processing blocks 21 includes a noise reduction block 23 corresponding to the noise reduction function 142 and a plurality of DC blocks 24 corresponding to the DC function 143. It suffices that the number of DC blocks 24 connected to the noise reduction block 23 corresponds to the number of different resolution data items input to the network model 20. Although the DC blocks are disposed after the noise reduction block 23 in the example shown in FIG. 2, the anteroposterior relationship of connection between the noise reduction block 23 and the DC blocks 24 is not limited, and the noise reduction block 23 may be disposed after the DC blocks 24.

The noise reduction block 23 is, for example, a neural network block constituted by a deep neural network such as a deep convolutional neural network. The noise reduction block 23 is a type of function and typically has parameters that can be trained. The noise reduction block 23 may be formed of a MoDL or unroll neural network disclosed in non-patent literature 1 or formed of a recurrent neural network such as a long-short-term memory (LSTM) or a gated recurrent unit (GRU). Input data is input to the noise reduction block 23, and the noise reduction block 23 outputs noise-reduced data obtained by reducing the noise of the input data.

If the input data is MR data, the noise to be reduced includes, but is not particularly limited to, noise attributed to the non-uniformity of the magnetostatic field as well as noise attributed to data collection, noise attributed to signal processing on an MR signal, noise attributed to data processing on the k-space data or spectrum, and the like. If the input data is CT data, the noise includes, but is not particularly limited to, noise attributed to data collection such as a metal artifact and a low-count artifact.

The DC blocks 24 are blocks for enhancing (improving) the data consistency, which reduces a data error. The DC blocks 24, like the noise reduction block 23, are neural networks or a type of function and typically has a parameter that can be trained. For example, when collected data is defined as y, processing of searching for an image x that minimizes the formula (1) below may be performed in the DC blocks 24. That is, when the collected data y is k-space data, an error between k-space data Ax and the k-space data y is reduced.

$$\|Ax-y\|_2^2 + \lambda R((x, x_{denoise}) \tag{1}$$

A denotes a Fourier transform, and the image x is transformed into the k-space data by "Ax". $\lambda R(x, x_{denoise})$ denotes an error term for an output value of the noise reduction block 23. $\lambda$ is a parameter related to the error term and is a value trained in the training of the network model 20. For example, when the output value of the noise reduction block 23 is defined as $x_{denoise}$, R(x) can be represented by the formula (2) below. In this case, the minimization problem of the formula (1) can be solved by, for example, a conjugate gradient method.

$$R(x) = \|x - x_{denoise}\|_2^2 \tag{2}$$

Noise-reduced data is input to the DC blocks 24, and DC-processed data with a reduced error between the collected data and the noise-reduced data is output.

The output block 22 includes a single noise reduction block 23 and a single DC block 24. The DC block 24 is arranged to correspond to the temporal resolution of resolution data desired to be output from the network model 20. In the example shown in FIG. 2, a single DC block 24 is arranged in order to output a single high-quality data item corresponding to a third resolution of third resolution data from the network model 20; however, the number of DC blocks 24 arranged may be determined according to the number of items of data output from the network model 20.

In the network model 20, some or all of the noise reduction blocks 23 may have a common configuration, or all of the noise reduction blocks 23 may have different configurations. Likewise, some or all of the DC blocks 24 may have a common configuration, or all of the DC blocks 24 may have different configurations.

When training the network model 20, a plurality of resolution data each having different temporal resolutions are input, as input data, to the processing block 21 in the first stage of the network model 20. In the example shown in FIG. 2, the first resolution data 25 having the first temporal resolution, the second resolution data 26 having the second temporal resolution, and the third resolution data 27 having the third resolution are input to the processing block. For convenience of explanation, the present embodiment assumes that the first temporal resolution is the lowest resolution and that resolution data having the largest ordinal number among the input resolution data items have the highest temporal resolution. Namely, in the example shown in FIG. 2, it is assumed that the first temporal resolution is the lowest temporal resolution and that the third temporal resolution is the highest temporal resolution.

Not only the three different resolution data items but also the n-th resolution data item having the n-th temporal resolution (wherein n is a natural number of four or higher) may be input to the processing block 21, in which case DC blocks 24 corresponding to n resolution data items may be arranged in the processing block 21. As a matter of course, two DC blocks 24 may be arranged for each processing block in the network model 20, so that two resolution data items having different temporal resolutions are processed.

On the other hand, in the present embodiment, correct data corresponding to the third resolution data having the highest temporal resolution, for example, can be used as correct data for the training. The correct data may be data of an image captured in advance or past data. With the training function 144, the processing circuitry 14 applies the network model 20 to a plurality of resolution data items, whereby the noise reduction processing and the DC processing are executed and output data integrating DC-processed data from the first temporal resolution to the n-th temporal resolution is output in the output block 22.

With the training function 144, the processing circuitry 14 uses a stochastic gradient descent method and an error backpropagation method, etc., to update trainable parameters such as the weight and the bias of the noise reduction blocks 23 and the DC blocks 24 of the network model 20 so as to minimize a value of loss between the output data and the correct data calculated by a loss function. Any method can be applied as long as it is a training method used in the so-called "supervised learning". When the training is completed, a trained model concerning the network model 20 is generated.

When using the network model 20, the processing circuitry 14 implements the model execution function 145 to input the first to third resolution data to the network model 20, so that high-quality data 28 corresponding to the third temporal resolution and having a reduced noise and a reduced error (i.e., having an enhanced data consistency) as compared to the third resolution data is output.

Although the example in which the noise reduction blocks 23 and the DC blocks 24 are alternately arranged is shown, the noise reduction blocks 23 and the DC blocks 24 need not be arranged alternately. Also, the DC blocks 24 need not necessarily be arranged after the noise reduction blocks 23. There may be, for example, a region in which the noise reduction blocks 23 are arranged continuously.

According to the first embodiment described above, a plurality of resolution data items each having different temporal resolutions are used to train a network model configured so that one or more noise reduction blocks and one or more DC blocks corresponding to the respective resolution data items are connected to each other, and generate a trained model. Thus, the accuracy of the training of the network model can be enhanced. Accordingly, when using the trained model, it is possible to generate high-quality data with reduced noise while performing error reduction in the respective input data items having different temporal resolutions in consideration of the data consistency, which leads to enhanced performance of the trained model and enhanced quality of an output image.

Second Embodiment

Figure 2:
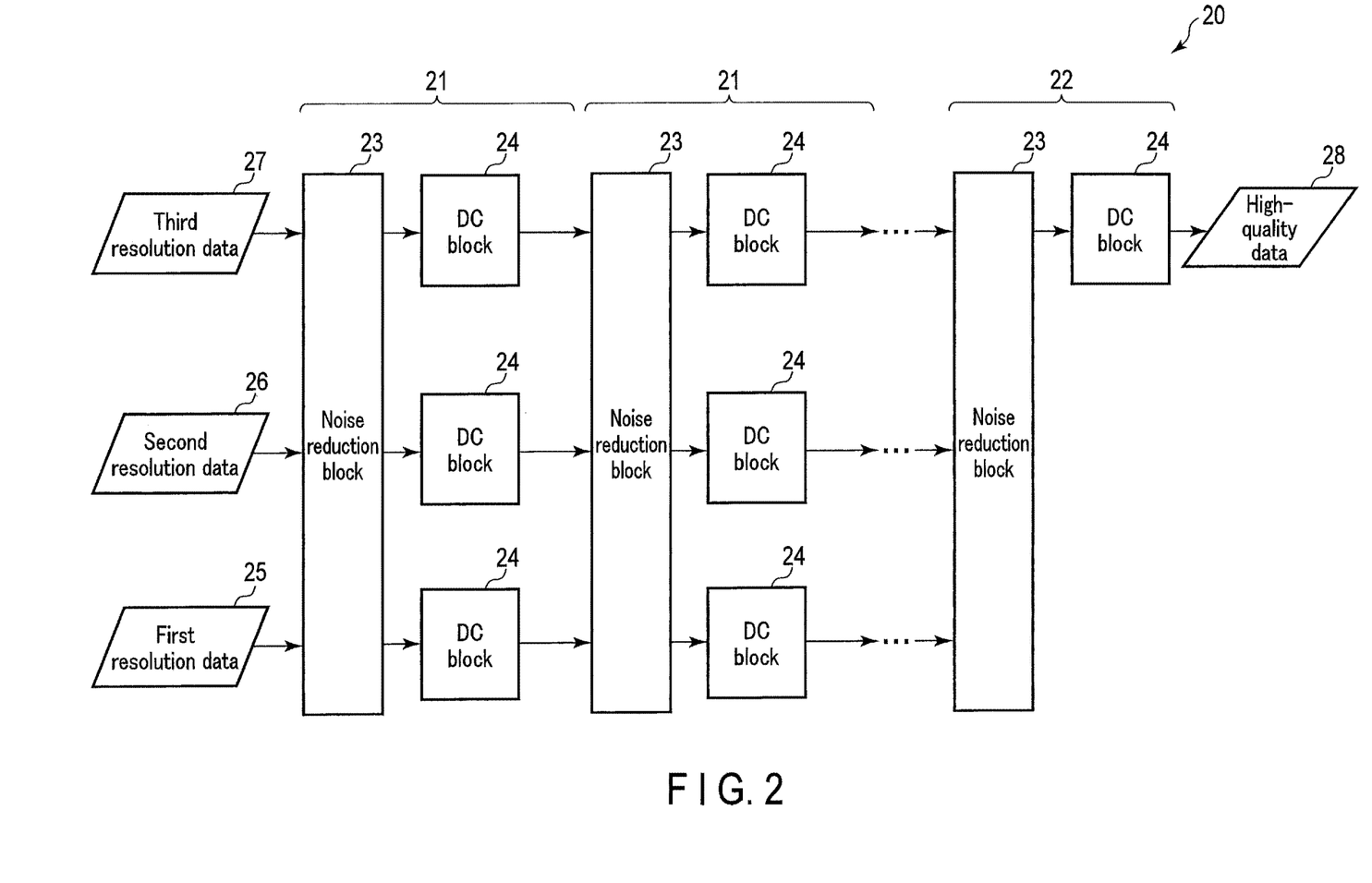
FIG. 2 is a diagram showing a network model according to a first embodiment.

In the case of the network model shown in FIG. 2 according to the first embodiment, a plurality of resolution data items are computed in a single processing block; thus, as the number of processing blocks 21 increases, the number of DC blocks 24 also increases, likely resulting in an increase in the computation amount for obtaining an output value. Accordingly, in a second embodiment, a partial network is designed which executes the noise reduction processing and the DC processing a predetermined number of times for each resolution data item, in which point the second embodiment differs from the first embodiment. With this configuration, when calculating parameters of a DC block 24 concerning certain resolution data item, there is no need to calculate information on parameters of a DC block 24 concerning another resolution data item arranged in the earlier stage, which makes it possible to reduce calculation costs related to the DC processing.

Since the functional configuration of the medical information processing apparatus 1 according to the second embodiment is the same as that of the first embodiment, description thereof will be omitted.

Next, the network model according to the second embodiment will be described with reference to FIG. 3.

Figure 3:
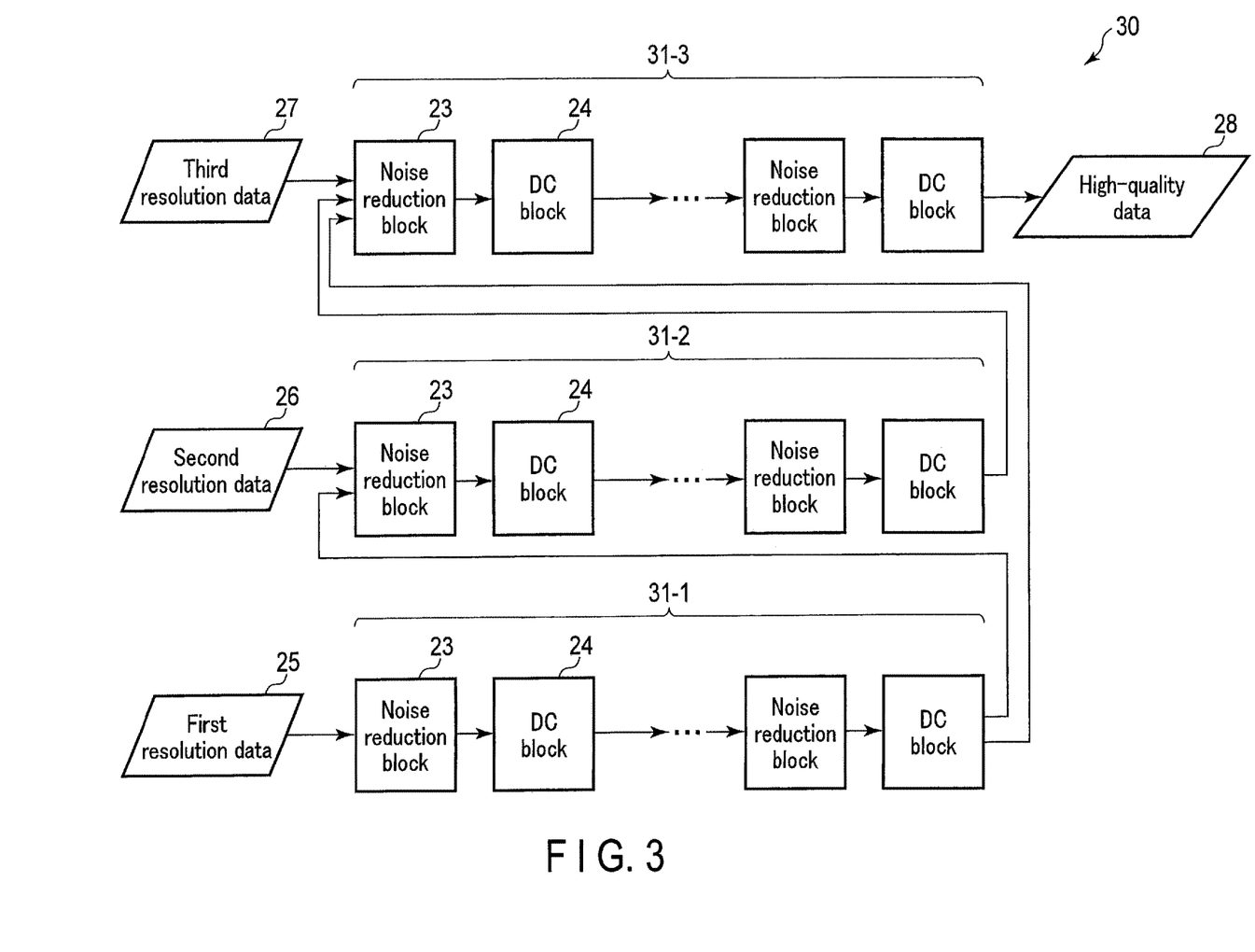
FIG. 3 is a diagram showing a network model according to a second embodiment.

A network model 30 shown in FIG. 3 includes multiple partial networks 31 so as to correspond to a plurality of resolution data items one for one. Specifically, a first partial network 31-1 is designed for the first resolution data, a second partial network 31-2 is designed for the second resolution data, and a third partial network 31-3 is designed for the third resolution data. The noise reduction blocks 23 and the DC blocks 24 have the same configuration as that of the first embodiment; for example, some or all of the noise reduction blocks 23 and the DC blocks 24 may have a common configuration, or all of them may have different configurations.

It is assumed that the respective partial networks 31 are configured so that the noise reduction blocks 23 and the DC blocks 24 are alternately arranged in multiple stages; however, they need not necessarily be alternately arranged in multiple stages, and for example only one DC block 24 may be arranged as the last block of the partial network 31. Although the example is shown in which a set of the noise reduction blocks 23 and the DC blocks 24 arranged after the respective noise reduction blocks 23 are executed multiple times, a set of the DC blocks 24 and the noise reduction blocks 23 arranged after the respective DC blocks 24 may be executed multiple times.

In the network model 30, processing is performed in the order from the first resolution data to the third resolution data, that is, performed in sequence starting from the resolution data having the lowest temporal resolution toward the resolution data having the highest temporal resolution among the plurality of resolution data items.

In the network model 30, output data is generated for each partial network. Together with the resolution data in the latter stage, the generated output data is input to the respective partial networks corresponding to the resolution data in the latter stage.

Next, an example of the training process of the medical information processing apparatus 1 according to the second embodiment will be described with reference to the flowchart shown in FIG. 4 and the network model 30 shown in FIG. 3.

In step S401, the processing circuitry 14 implements the acquisition function 141 to acquire the first resolution data.

In step S402, the processing circuitry 14 implements the processing function to execute the noise reduction processing by the noise reduction blocks 23 and the DC processing by the DC blocks 24 multiple times by applying the first partial network 31-1 to the first resolution data. As a result, first output data is output by the first partial network 31-1.

In step S403, the processing circuitry 14 implements the acquisition function 141 to acquire the second resolution data.

In step S404, the processing circuitry 14 implements the processing function to execute the noise reduction processing by the noise reduction blocks 23 and the DC processing by the DC blocks 24 multiple times by applying the second partial network 31-2 to the second resolution data and the first output data from the first partial network 31-1. As a result, second output data is generated by the second partial network 31-2.

In step S405, the processing circuitry 14 implements the acquisition function 141 to acquire the third resolution data.

In step S406, the processing circuitry 14 implements the processing function to apply the third partial network 31-3 to the third resolution data, the first output data from the first partial network 31-1, and the second output data from the second partial network 31-2. Namely, the processing circuitry 14 executes the noise reduction processing by the noise reduction blocks 23 and the DC processing by the DC blocks 24 multiple times on the third resolution data, the first output data, and the second output data. As a result, third output data is generated by the third partial network 31-3.

In step S407, the processing circuitry 14 implements the training function 144 to calculate a value of loss between the output data and the correct data based on a loss function. Specifically, a loss function generally used in the machine learning, such as mean squared error, mean absolute error, VGG16 loss (e.g., "Very Deep Convolutional Networks for Large-Scale Image Recognition", ICLR 2015, arxiv: 1409.1556), or discriminator, may be adopted. In the respective partial networks 31, a loss value based on the output data may be calculated, and a weighted sum of the loss values may be set as a loss function.

In step S408, the processing circuitry 14 implements the training function 144 to determine whether the training has been completed or not. It may be determined that the training has been completed, for example, when the training at a predetermined number of epochs is completed or when the loss value is equal to or less than a threshold. When the training is completed, the update of the parameters is terminated and the process is completed. The trained model is thus generated. On the other hand, when the training is not completed, the process proceeds to step S409.

In step S409, the processing circuitry 14 implements the training function 144 to update network-related parameters such as the weight and the bias of the noise reduction blocks 23 and the DC blocks 24 of the network model 30 so as to minimize a loss value. After the parameters are updated, the process returns to step S401, and the same processing is repeated.

As in the case of the network model 20 according to the first embodiment, when using the trained model of the network model 30 according to the second embodiment, the processing circuitry 14 implements the model execution function 145 to input the first to third resolution data to the network model 30, and high-quality data 28 corresponding to the third temporal resolution and having a reduced noise and a reduced error (i.e., having an enhanced data consistency) as compared to the third resolution data is output.

Figure 4:
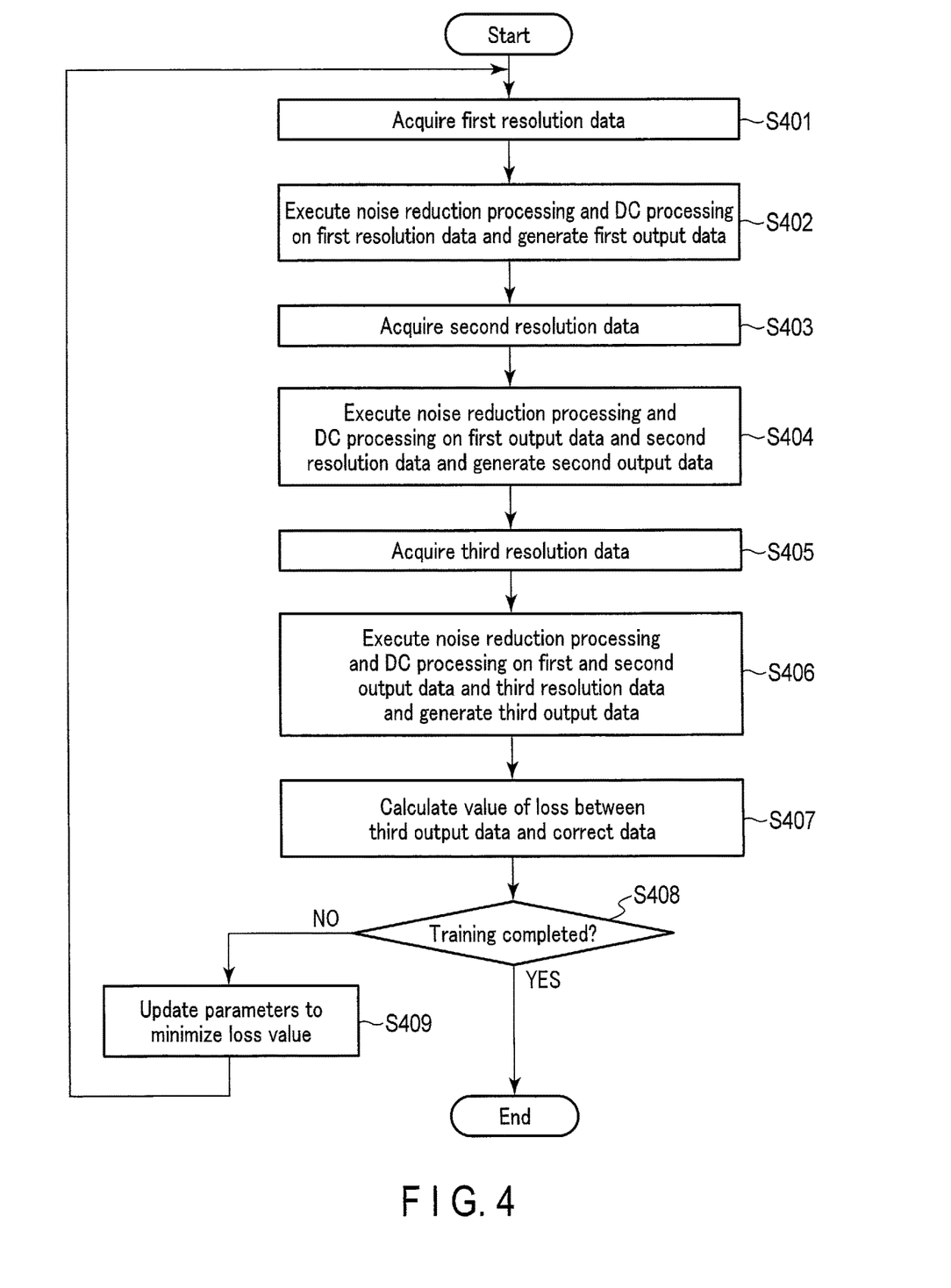
FIG. 4 is a flowchart showing an example of a training process of a medical information processing apparatus according to the second embodiment.

In FIG. 4, it is assumed that one loss value is calculated for the entire network model 30; however, the embodiment is not limited thereto. The training of the network model 30 may be performed separately for each partial network. Specifically, for example, the parameters of the partial networks may be updated so as to minimize the loss value calculated for each partial network, and the training may be completed in units of partial networks in the order from the first partial network to fix the parameters.

Figure 5:
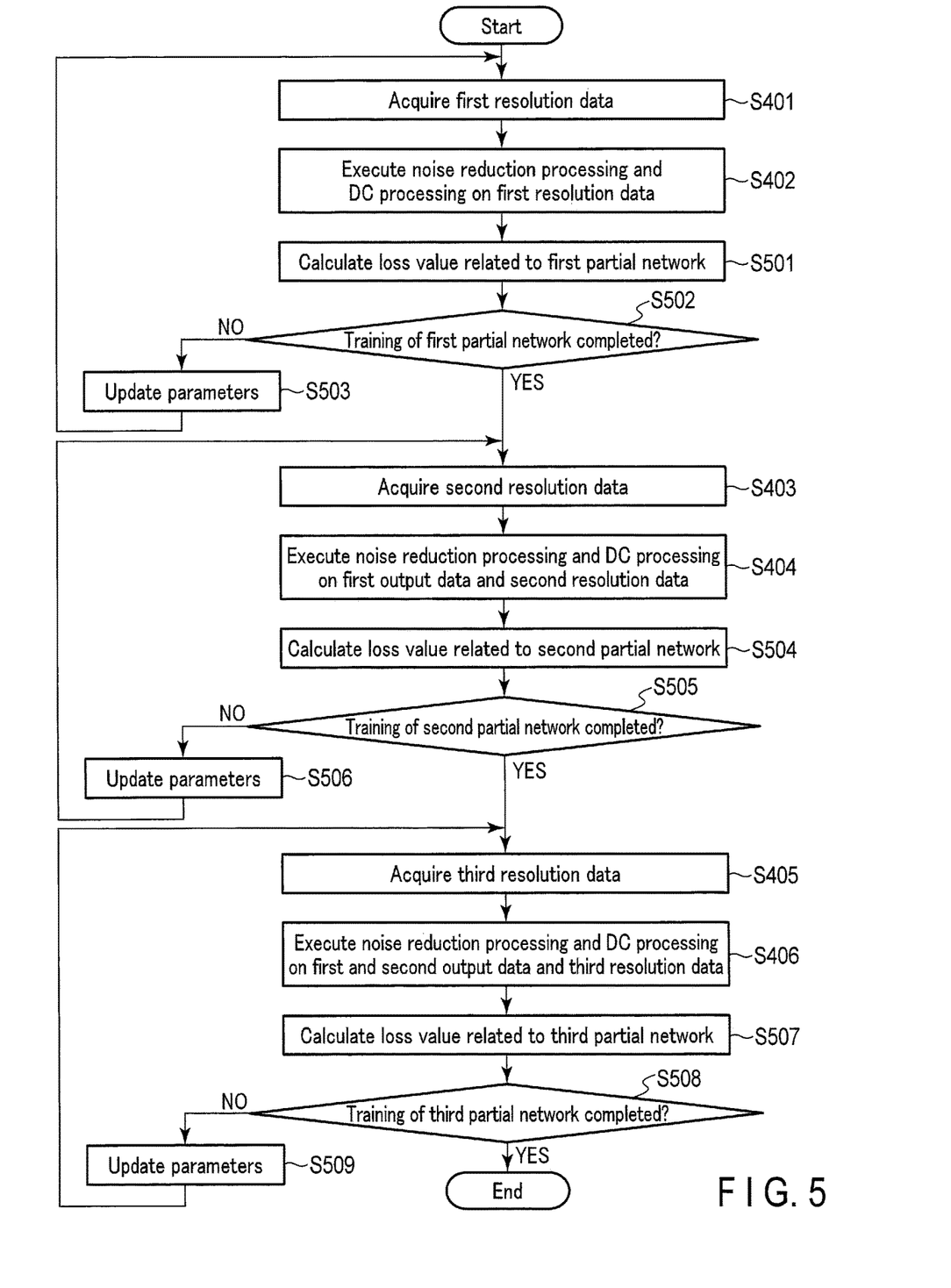
FIG. 5 is a flowchart showing an example of a training process for each partial network according to the second embodiment.

An example of the training process for each partial network will be described with reference to FIG. 5.

Like the case shown in FIG. 4, in steps S401 and S402, the processing circuitry 14 acquires the first resolution data and performs the noise reduction processing and the DC processing, after which the first output data is generated.

In step S501, the processing circuitry 14 implements the acquisition function 141 to, for example, acquire correct data related to the first resolution data prepared in advance, and implements the training function 144 to calculate a value of loss between the first output data and the correct data using a loss function.

In step S502, the processing circuitry 14 determines whether the training has been completed or not in the same manner as in step S409 shown in FIG. 4. When the training is completed, the parameters of the first partial network 31-1 such as the weight are fixed. When the training is not completed, the process proceeds to step S503.

In step S503, the processing circuitry 14 implements the training function 144 to update the parameters concerning the first partial network 31-1 so as to minimize a loss value. After the parameters are updated, the process returns to step S401, and the same processing is repeated.

Subsequently, in steps S405 and S406, the processing circuitry 14 acquires the second resolution data and performs the noise reduction processing and the DC processing, after which the second output data is generated together with the second resolution data and the first output data.

In step S504, the processing circuitry 14 implements the acquisition function 141 to, for example, acquire correct data related to the second resolution data prepared in advance, and implements the training function 144 to calculate a value of loss between the second output data and the correct data using a loss function.

In step S505, the processing circuitry 14 determines whether the training has been completed or not. When the training is completed, the parameters of the second partial network 31-2 such as the weight are fixed. When the training is not completed, the process proceeds to step S506.

In step S506, the processing circuitry 14 implements the training function 144 to update the parameters concerning the second partial network 31-2 so as to minimize a loss value. After the parameters are updated, the process returns to step S405, and the same processing is repeated.

In steps S409 and S410, the processing circuitry 14 acquires the third resolution data and performs the noise reduction processing and the DC processing, after which the third output data is generated together with the third resolution data, the first output data, and the second output data.

In step S507, the processing circuitry 14 implements the acquisition function 141 to, for example, acquire correct data related to the third resolution data prepared in advance, and implements the training function 144 to calculate a value of loss between the third output data and the correct data using a loss function.

In step S508, the processing circuitry 14 determines whether the training has been completed or not. When the training is completed, the parameters of the third partial network 31-3 such as the weight are fixed. When the training is not completed, the process proceeds to step S509.

In step S509, the processing circuitry 14 implements the training function 144 to update the parameters concerning the third partial network 31-3 so as to minimize a loss value. After the parameters are updated, the process returns to step S409, and the same processing is repeated.

Next, a training image of each partial network 31 will be described with reference to FIGS. 6A to 6C.

Figure 6A:
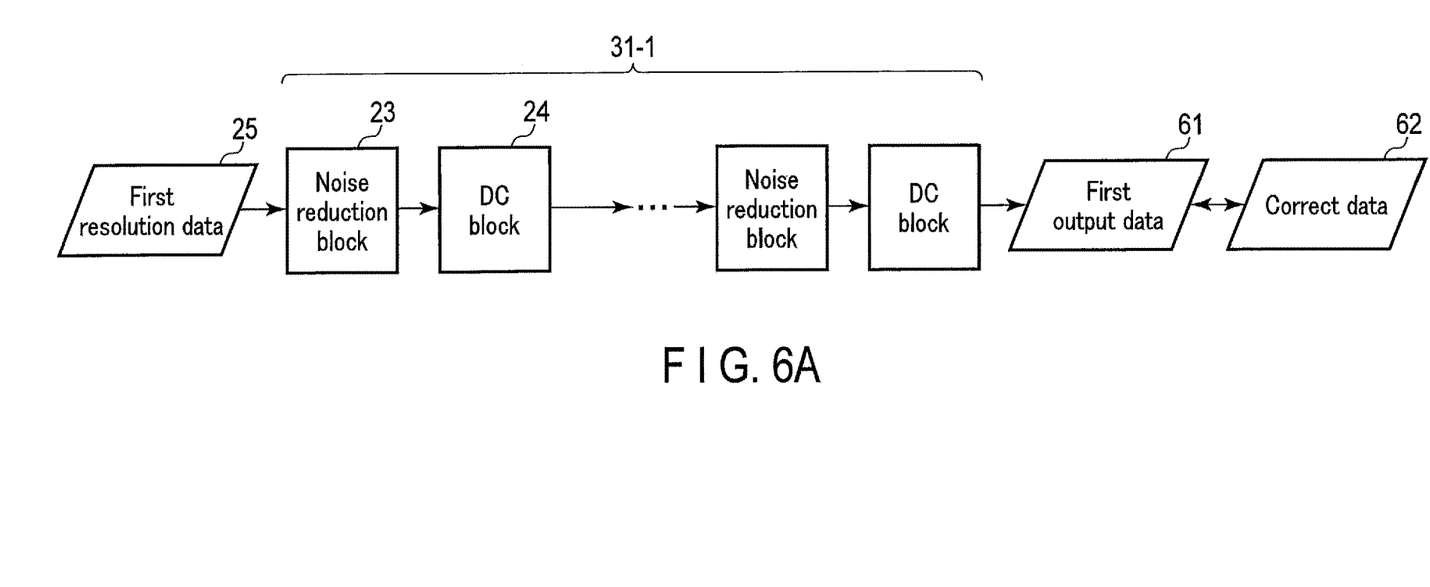
FIG. 6A is a diagram showing a training example for a first partial network.

FIG. 6A shows a training example of the first partial network 31-1.

The first resolution data 25 is input to the first partial network 31-1, and first output data 61 is output as the processing result of the first partial network 31-1. The parameters of the first partial network 31-1 are updated so as to minimize a loss value calculated from the first output data 61 and correct data 62 related to the first resolution data 25 using a loss function. Then, the training is completed. After the training is completed, the parameters of the first partial network 31-1 are fixed.

Figure 6B:
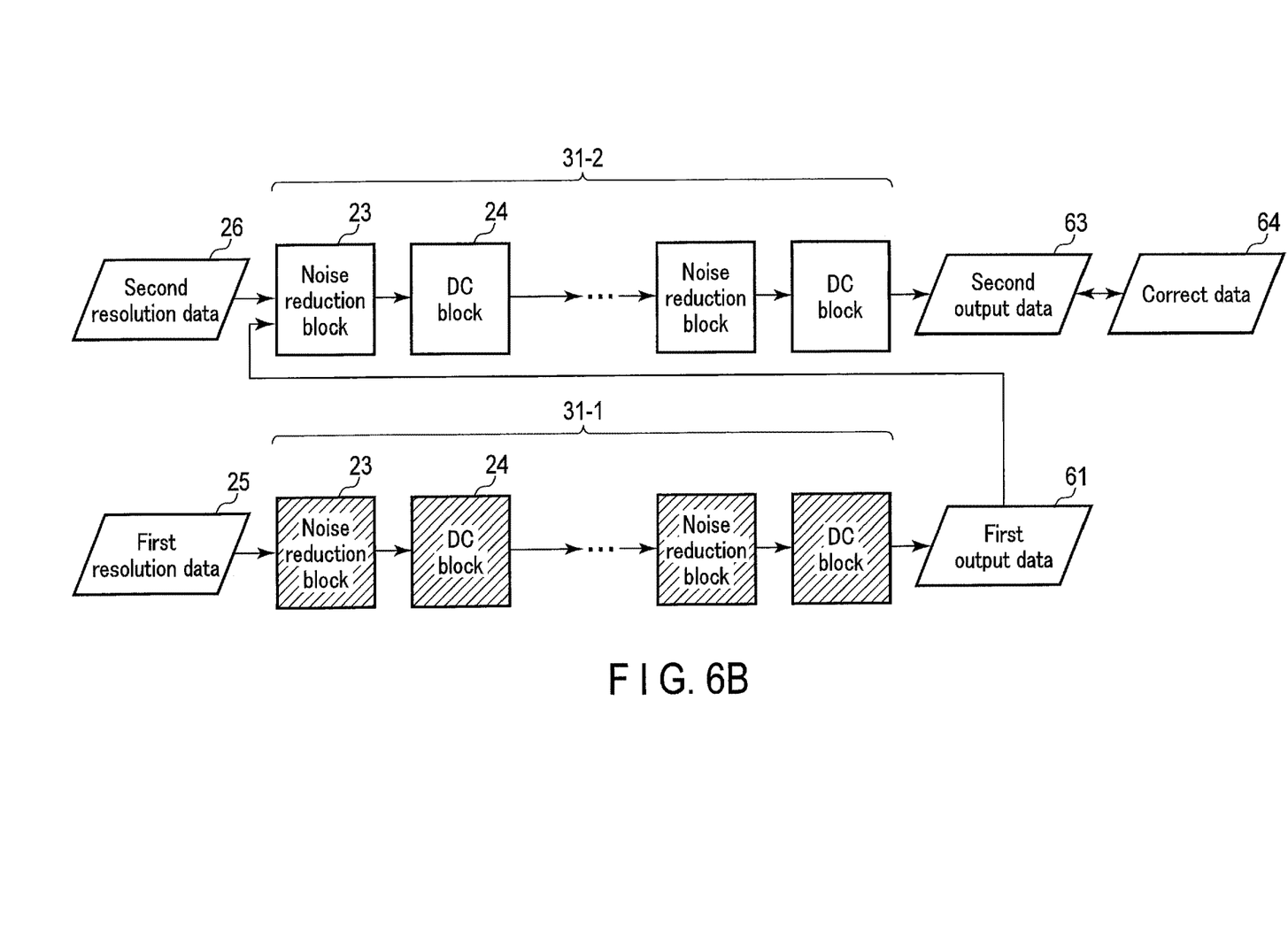
FIG. 6B is a diagram showing a training example for a second partial network.

FIG. 6B shows a training example of the second partial network 31-2.

When training the second partial network 31-2, the first resolution data 25 is input to the first partial network 31-1, and the second resolution data 26 and the first output data 61 from the first partial network 31-1 corresponding to the first resolution data 25 are input to the second partial network 31-2. Second output data 63 is output as the processing result of the second partial network 31-2. The training is performed so as to minimize a loss value calculated from the second output data 63 and correct data 64 related to the second resolution data 26 using a loss function. Since the training of the first partial network 31-1 has already been completed, the parameters thereof are fixed; thus, only the parameters of the second partial network 31-2 will be updated. The training of the second partial network 31-2 is also completed under predetermined termination conditions, and the parameters of the second partial network 31-2 are fixed.

Figure 6C:
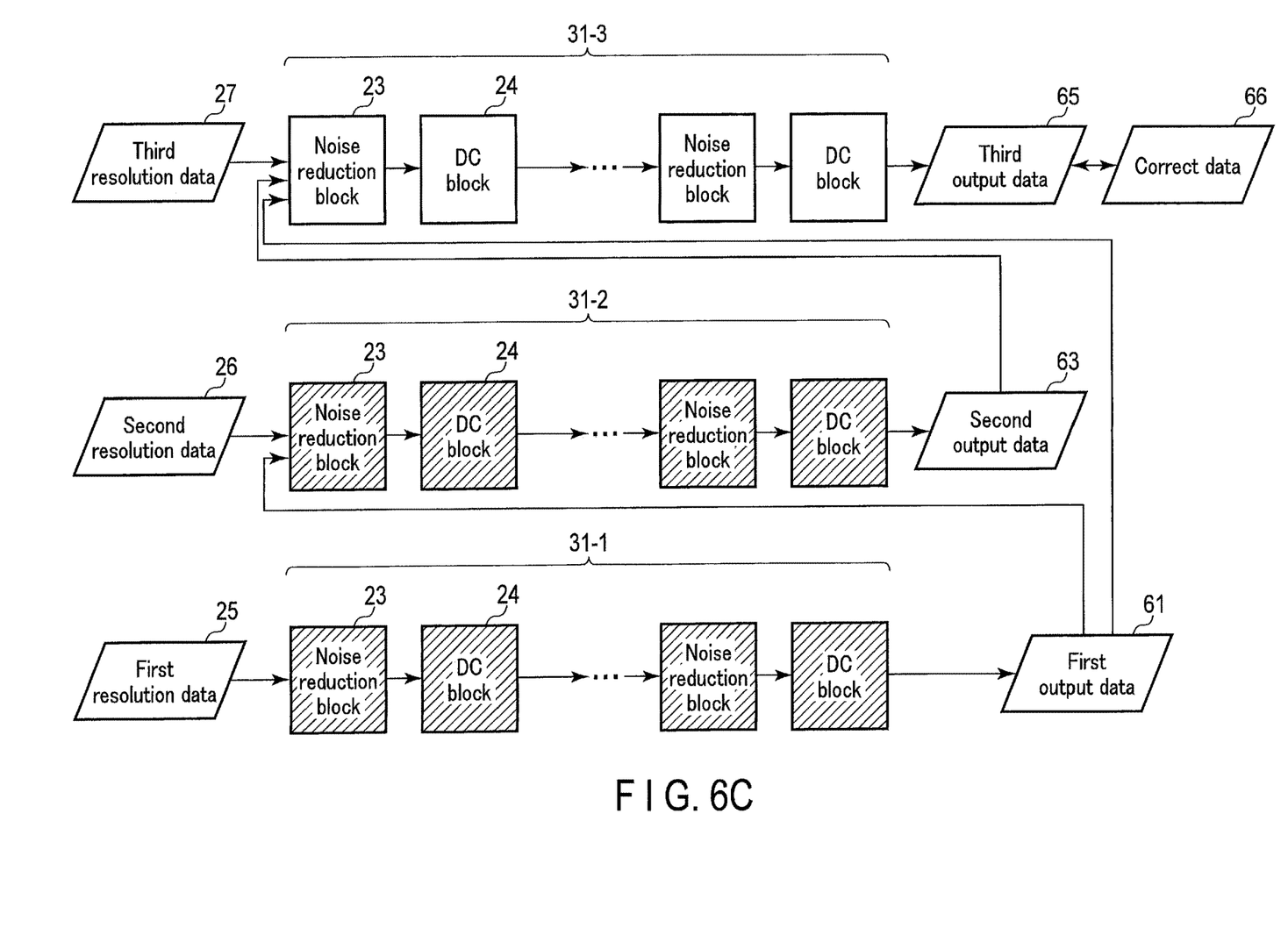
FIG. 6C is a diagram showing a training example for a third partial network.

FIG. 6C shows a training example of the third partial network 31-3.

When training the third partial network 31-3, the first resolution data 25 is input to the first partial network 31-1, the second resolution data 26 and the first output data 61 are input to the second partial network 31-2, and the third resolution data 27, the second output data 63 from the second partial network 31-2 corresponding to the second resolution data 26, and the first output data 61 are input to the third partial network 31-3. Third output data 65 is output as the processing result of the third partial network 31-3. The training is performed so as to minimize a loss value calculated from the third output data 65 and correct data 66 related to the third resolution data 27 using a loss function. Since the training of the first partial network 31-1 and the second partial network 31-2 have already been completed, the parameters thereof are fixed; thus, only the parameters of the third partial network 31-3 will be updated. The training of the third partial network 31-3 is also completed under predetermined termination conditions, and the parameters of the third partial network 31-3 are fixed. As a result, the training of the network model 30 is completed.

Since the training is performed for each partial network and the parameters of the partial networks are sequentially fixed, as described above, the calculation costs related to the parameters of the DC blocks 24 can be reduced.

Figure 7:
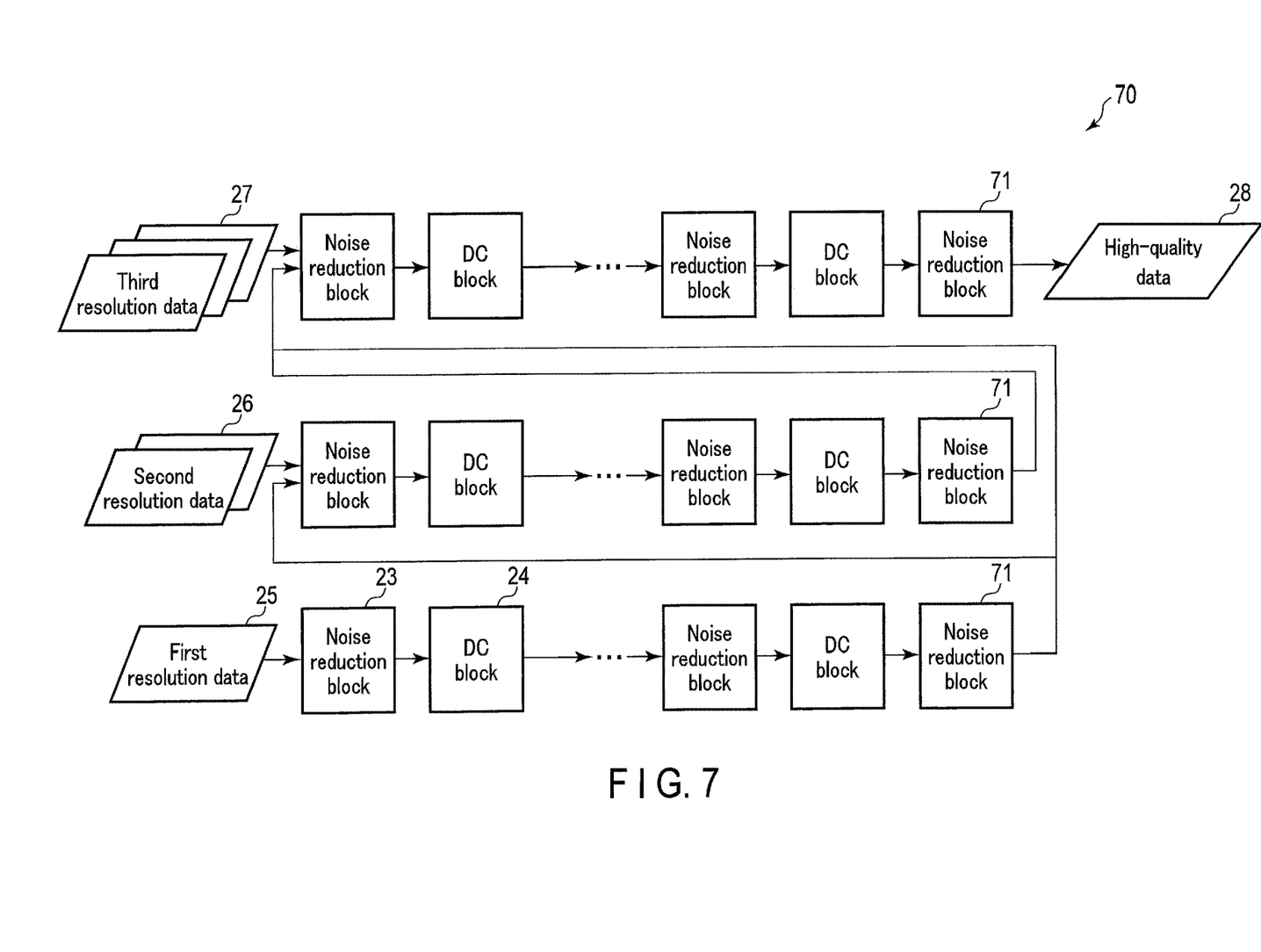
FIG. 7 is a diagram showing a first modification of the network model according to the second embodiment.

Next, a first modification of the network model according to the second embodiment will be described with reference to FIG. 7.

The partial networks 31 described above is configured so that the blocks are arranged in the order of the noise reduction block 23, the DC block 24, the noise reduction block 23, the DC block 24, . . . ; however, the configuration of the partial networks 31 is not limited thereto. As in a network model 70 according to the first modification shown in FIG. 7, a noise reduction block 71 may be arranged as the last block of the partial network. By configuring the last output layer among the noise reduction blocks 71 as a convolution layer of 1×1, a loss can be calculated in the state where an image has been formed.

Namely, the training of the network model 70 can be performed using a loss function and based on a value of loss between a correct image and an output image, which is output data from the last DC block of each partial network.

The network model 70 may be used as is; however, the network model 70 may be applied to the respective resolution data items, excluding the convolutional layers of 1×1 of the first partial network and the second partial network 31-2 other than the noise reduction block 71 of the third partial network from which it is desired to finally output data. This is because the convolutional layers of 1×1 have been used to calculate a loss caused when the training using an image is performed, and there is no need to utilize image data in the partial networks other than the partial network that finally generates output data from the network model after the parameters of the respective partial networks are determined.

Next, a second modification of the network model according to the second embodiment will be described with reference to FIG. 8.

When k-space data is used as resolution data, a DC block 81 may be arranged in the partial networks in the second and subsequent stages before the block to which output data from the partial network in the earlier stage is input.

Figure 8:
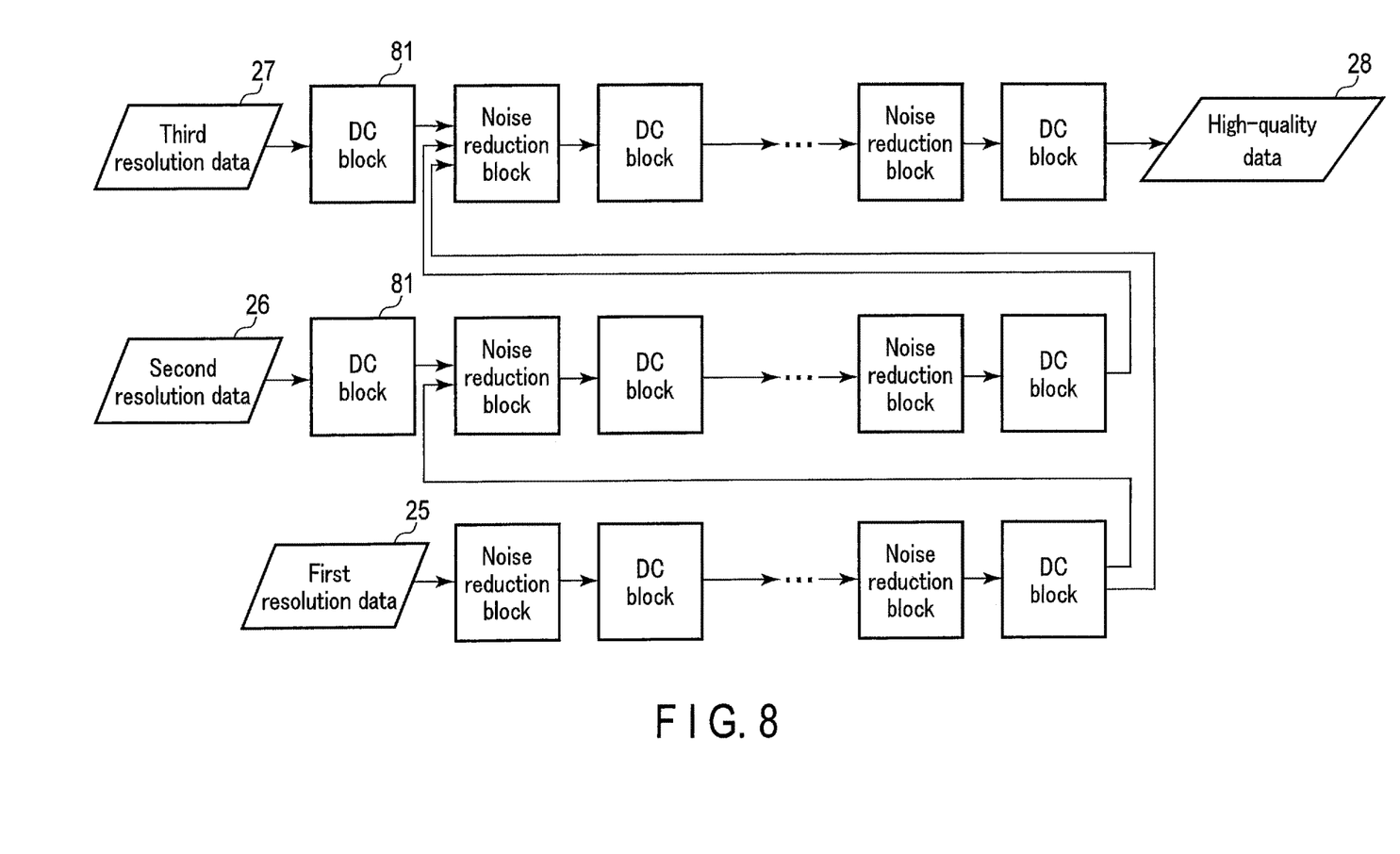
FIG. 8 is a diagram showing a second modification of the network model according to the second embodiment.

In the network model 80 according to the second modification shown in FIG. 8, the second resolution data (k-space data) is input to the DC block 81, and DC-processed data (k-space data) is output. The DC-processed data (k-space data) and the first output data are input to the noise reduction block 23 in the stage after the DC block 81, and the same processing is performed as that of the network described above.

Figure 9:
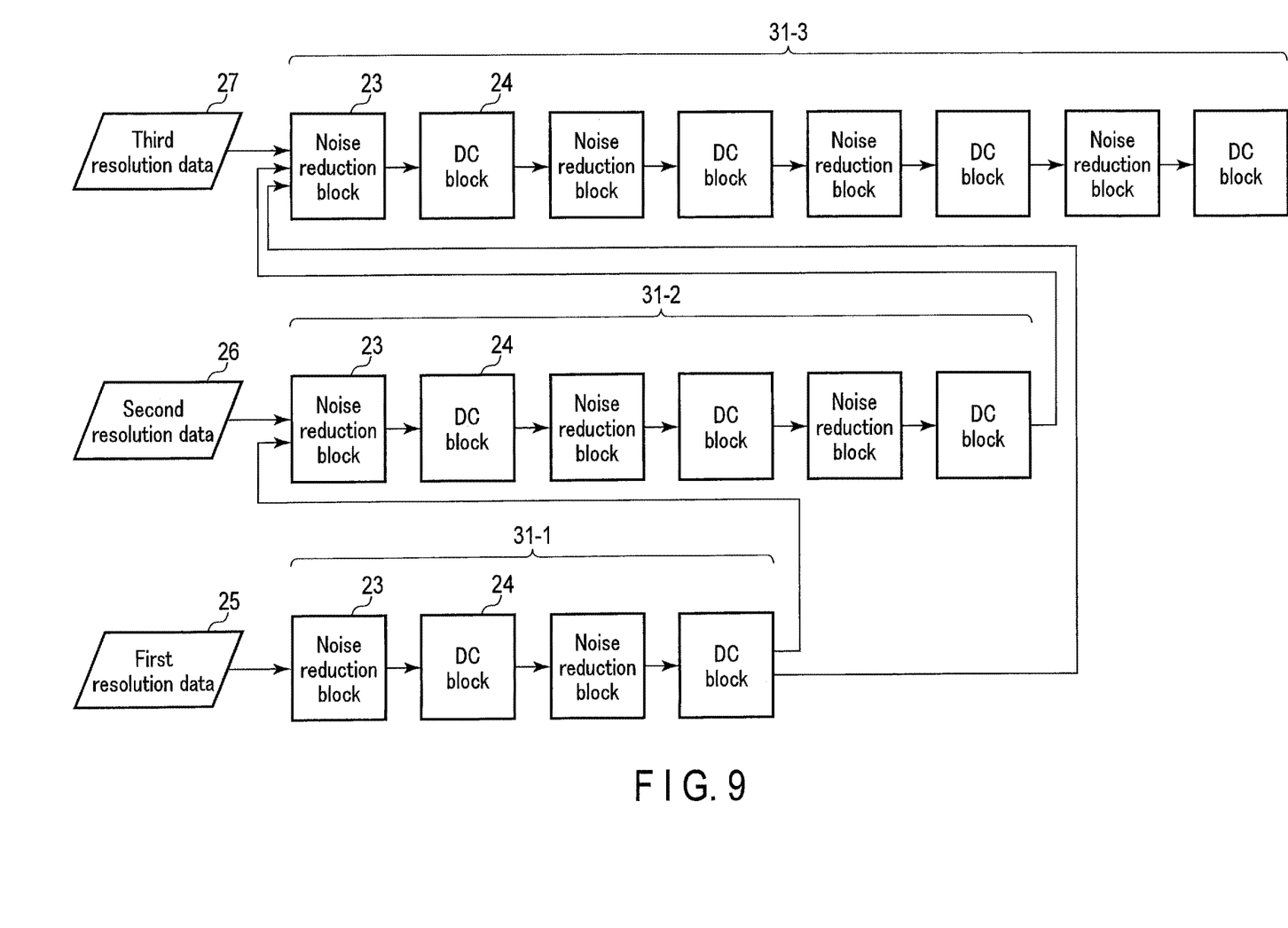
FIG. 9 is a diagram showing a third modification of the network model according to the second embodiment.

Next, a third modification of the network model according to the second embodiment will be described with reference to FIG. 9.

A network model 90 according to the third modification has a network configuration in which the number of DC blocks, that is, the number of times of executing the DC processing, increases for the partial network to which resolution data having a higher temporal resolution is input, as compared to the partial network to which resolution data having a lower temporal resolution is input. For example, the network model can be designed in such a manner as to have two DC blocks 24 in the first partial network 31-1, three DC blocks 24 in the second partial network 31-2, and four DC blocks 24 in the third partial network 31-3, as shown in FIG. 9. This allows for reduction of the overall calculation costs by intensively performing error reduction on the resolution data having a higher temporal resolution that will become output data of a trained model and reducing the degree of executing processing on the resolution data having a lower temporal resolution.

In the above-described embodiment, three different resolutions are described for the sake of convenience; however, the number of resolution data items that are input may be two, or four or more. Namely, when n (n being a natural number of two or more) resolution data items having different resolutions are used, a network model that includes partial networks respectively corresponding thereto may be designed.

In general terms, the following processing can be performed on the n-th partial network: the n-th resolution data item and n−1 items of output data from the first to the (n−1)-th output data item are input to the n-th partial network, the noise reduction processing and the DC processing by the DC blocks 24 are executed by the n-th partial network multiple times, and the n-th output data item is generated.

According to the second embodiment described above, partial networks are designed for different resolution data, and the training is performed in multiple stages so that the training is performed for each partial network. In addition, the resolution data that are input are processed in the order from data having a lower temporal resolution to data having a higher temporal resolution. This not only enhances the accuracy of training the network model, enhances the performance of the trained model, and also enhances the quality of an output image, but also reduces the costs of calculating parameters when executing training, as compared to the case where calculation is needed for all the resolution data that are input in connection with the parameters related to the DC blocks.

According to at least one of the above-described embodiments, it is possible to enhance image quality.

In addition, the functions described in the above embodiments may also be implemented by installing programs for executing the processing in a computer, such as a workstation, and expanding them in a memory. The programs that can cause the computer to execute the processing can be stored in a storage medium, such as a magnetic disk (a hard disk, etc.), an optical disk (CD-ROM, DVD, etc.), or a semiconductor memory and distributed through it.

The terminology "processor" used herein refers to, for example, a central processing unit (CPU), a graphics processing unit (GPU), or circuitry such as an application-specific integrated circuit (ASIC), a programmable logic device (such as a simple programmable logic device (SPLD), a complex programmable logic device (CPLD), or a field programmable gate array (FPGA)), and so on.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

In relation to the above embodiments, the following disclosures are additionally given as an aspect of the invention and alternative features thereof.

In an embodiment, a medical information processing apparatus comprising processing circuitry configured to:
acquire a plurality of input data items having different temporal resolutions each other; and
perform, on each of the input data items, one or more times of noise reduction processing of reducing noise and one or more times of DC processing of enhancing a data consistency, and generate output data items corresponding to each of the input data items.

In an embodiment, the processor may perform the noise reduction processing and the DC processing alternately multiple times.

The invention claimed is:

1. A medical information processing apparatus comprising processing circuitry configured to:
acquire a plurality of resolution data items having different resolutions from each other; and
perform, on each of the plurality of resolution data items, one or more times of first noise reduction processing of reducing noise and one or more times of first DC processing of enhancing a data consistency, and generate output data items corresponding to each of the plurality of resolution data items, wherein the processing circuitry is configured to, when processing the second and subsequent resolution data items, perform one or more times of second noise reduction processing and one or more times of second DC processing on a target resolution data item and one or more output data items generated before the target resolution data item, and generate a newly output data item.

2. The medical information processing apparatus according to claim 1, wherein the processing circuitry processes the plurality of resolution data items in sequence starting from a resolution data item having a lowest resolution among the plurality of resolution data items.

3. The medical information processing apparatus according to claim 1, wherein the processing circuitry performs the first noise reduction processing and the first DC processing, or the second noise reduction processing and the second DC processing on one of the resolution data items alternately multiple times.

4. The medical information processing apparatus according to claim 1, wherein the processing circuitry performs multiple times a set of execution of the first noise reduction processing and execution of the first DC processing after the first noise reduction processing, or a set of execution of the second noise reduction processing and execution of the second DC processing after the second noise reduction processing.

5. The medical information processing apparatus according to claim 1, wherein the processing circuitry performs multiple times a set of execution of the first DC processing and execution of the first noise reduction processing after the first DC processing, or a set of execution of the second DC processing and execution of the second noise reduction processing after the second DC processing.

6. The medical information processing apparatus according to claim 1, wherein the processing circuitry performs DC processing on second resolution data having a second resolution more times than on first resolution data having a first resolution, the second resolution being higher than the first resolution.

7. The medical information processing apparatus according to claim 1, wherein a type of the resolution data items is k-space data, a magnetic resonance (MR) image, projection data, sinogram data, or a computed tomography (CT) image.

8. A medical information processing method, comprising:
acquiring a plurality of resolution data items having different resolutions from each other; and
performing, on each of the plurality of resolution data items, one or more times of first noise reduction processing of reducing noise and one or more times of first DC processing of enhancing a data consistency, and generating output data items corresponding to each of the plurality of resolution data items,
when processing the second and subsequent resolution data items, performing one or more times of second noise reduction processing and one or more times of second DC processing on a target resolution data item and one or more output data items generated before the target resolution data item, and generating a newly output data item.

9. The medical information processing method according to claim 8, wherein the performing processes the plurality of resolution data items in sequence starting from a resolution data item having a lowest resolution among the plurality of resolution data items.

10. The medical information processing method according to claim 8, wherein the performing performs the first noise reduction processing and the first DC processing, or the second noise reduction processing and the second DC processing on one of the resolution data items alternately multiple times.

11. The medical information processing method according to claim 8, wherein the performing performs multiple times a set of execution of the first noise reduction processing and execution of the first DC processing after the first noise reduction processing, or a set of execution of the second noise reduction processing and execution of the second DC processing after the second noise reduction processing.

12. The medical information processing method according to claim 8, wherein the performing performs multiple times a set of execution of the first DC processing and execution of the first noise reduction processing after the first DC processing, or a set of execution of the second DC processing and execution of the second noise reduction processing after the second DC processing.

13. The medical information processing method according to claim 8, wherein the performing performs DC processing on second resolution data having a second resolution more times than on first resolution data having a first resolution, the second resolution being higher than the first resolution.

14. The medical information processing method according to claim 8, wherein a type of the resolution data items is k-space data, a magnetic resonance (MR) image, projection data, sinogram data, or a computed tomography (CT) image.

15. A non-transitory storage medium storing a program that causes processing circuitry to:
acquire a plurality of resolution data items having different resolutions from each other; and
perform, on each of the plurality of resolution data items, one or more times of first noise reduction processing of reducing noise and one or more times of first DC processing of enhancing a data consistency, and generate output data items corresponding to each of the plurality of resolution data items, wherein
when processing the second and subsequent resolution data items, the program causes the processing circuitry to perform one or more times of second noise reduction processing and one or more times of second DC processing on a target resolution data item and one or more output data items generated before the target resolution data item, and generate a newly output data item.

* * * * *